(12) United States Patent
Khaja et al.

(10) Patent No.: US 8,999,800 B2
(45) Date of Patent: Apr. 7, 2015

(54) METHOD OF REDUCING CONTACT RESISTANCE

(71) Applicant: Varian Semiconductor Equipment Associates, Inc., Gloucest, MA (US)

(72) Inventors: Fareen Adeni Khaja, Gloucester, MA (US); Benjamin Colombeau, Salem, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/921,678

(22) Filed: Jun. 19, 2013

(65) Prior Publication Data

US 2014/0162442 A1    Jun. 12, 2014

Related U.S. Application Data

(60) Provisional application No. 61/736,212, filed on Dec. 12, 2012.

(51) Int. Cl.
| | |
|---|---|
| *H01L 21/306* | (2006.01) |
| *H01L 21/425* | (2006.01) |
| *H01L 29/66* | (2006.01) |
| *H01L 21/265* | (2006.01) |
| *H01L 21/285* | (2006.01) |
| *H01L 21/324* | (2006.01) |

(52) U.S. Cl.
CPC ........ *H01L 29/665* (2013.01); *H01L 21/26513* (2013.01); *H01L 21/28518* (2013.01); *H01L 21/324* (2013.01)

(58) Field of Classification Search
CPC ..................... H01L 21/26513; H01L 21/2257; H01J 2237/31701
USPC .............. 438/301, 530, 534, 533; 250/492.21
See application file for complete search history.

(56) References Cited

U.S. PATENT DOCUMENTS

| | | | |
|---|---|---|---|
| 3,655,457 A | | 4/1972 | Duffy et al. |
| 4,788,160 A | * | 11/1988 | Havemann et al. ............ 438/305 |
| 5,874,342 A | * | 2/1999 | Tsai et al. ..................... 438/301 |
| 6,111,620 A | * | 8/2000 | Nishiki et al. ................. 349/54 |

(Continued)

FOREIGN PATENT DOCUMENTS

WO     2010039807 A2     4/2010

OTHER PUBLICATIONS

Zhen Zhang et al., "Schottky-Barrier Height Tuning by Means of Ion Implantation Into Preformed Silicide Films Followed by Drive-In Anneal," IEEE Electron Device Letters, IEEE Service Center, New York, NY, 28 (7), Jul. 1, 2007, 565-568.

(Continued)

*Primary Examiner* — Mary Wilczewski
*Assistant Examiner* — Erik T Peterson (57) ABSTRACT

In one embodiment a method of forming low contact resistance in a substrate includes forming a silicide layer on the substrate, the silicide layer and substrate defining an interface therebetween in a source/drain region, and performing a hot implant of a dopant species into the silicide layer while the substrate is at a substrate temperature greater than 150° C., where the hot implant is effective to generate an activated dopant layer containing the dopant species, and the activated dopant layer extends from the interface into the source/drain region.

20 Claims, 4 Drawing Sheets

(56) References Cited

U.S. PATENT DOCUMENTS

2011/0073922 A1* 3/2011 Ohmi et al. .................. 257/288
2011/0171795 A1* 7/2011 Tsai et al. .................... 438/232

OTHER PUBLICATIONS

Dubois, E. et al., "Recent advances in metallic source/drain MOSFETs," Junction Technology 2008, IWJT '08 Extended Abstraction—2008 8th International Workshop on, IEEE, Piscataway, NJ May 15, 2008, pp. 139-144.

Jiang, H. et al., "Shallow n<+> junction formation using ion mixing of tungsten at elevated temperatures," Thin Solid Films, Elsevier-Sequiois SA, 192(1), Nov. 1, 1990, 59-71.

Chapman, G. et al., "Silicide formation by high-dose si<+>-ion implantation of Pd," J. App. Phys., 50 (10), Oct. 1, 1979, 6321-6327.

Chern, J., et al., Determining Contact Resistivity from Contact End Resistance Measurement, IEEE Electron Device Letters EDL-5, May 1984, pp. 178-180, No. 5, IEEE.

* cited by examiner

METHOD OF REDUCING CONTACT RESISTANCE

RELATED APPLICATIONS

This application claims priority to U.S. provisional patent application No. 61/736,212, filed Dec. 12, 2012.

FIELD

Embodiments relate to the field of semiconductor device fabrication. More particularly, the present embodiments relate to a method for fabricating low contact resistance devices.

BACKGROUND

As device size scales downwardly for devices such as metal oxide field effect transistors (MOSFET) including complementary metal oxide semiconductors (CMOS), a factor limiting device performance is parasitic resistance, which includes contact resistance between metal contact to the source/drain (S/D) regions of the device. The contact resistance $R_c$ is characterized by a specific contact resistivity or contact resistivity $\rho_c$ in units of $\Omega cm^2$.

In typical CMOS devices, including both p-type field effect transistors (pFET) and n-type field effect transistors (nFET), S/D contacts are created by forming a metal contact such as a silicide on top of a source/drain region. In conventional approaches, the silicide contact is formed on a silicon region that is previously implanted to a desired level with dopant species such as phosphorous (P) or Arsenic (As) in the case of nFETs and boron (B) in the case of pFETs. In a typical "salicide" process for forming a silicide, a precursor metal such as Ni, Ti, Co, Pt, or an alloy of such metal materials is deposited upon the semiconductor source/drain region, after which an annealing process is conducted to react the precursor metal to form a metal silicide by solid state interdiffusion between the semiconductor source drain and metal. The contact resistance of the silicide contact thus formed depends in part on the level of active dopants in the source/drain region proximate the silicide/semiconductor interface. One alternative approach that has recently been used to attempt to lower contact resistance is to perform room temperature implantation of dopant species through a silicide contact layer after the silicide has been formed. After room temperature implantation, annealing of the implanted substrate is performed to activate dopants and drive the dopants toward the silicide/semiconductor interface.

The above approaches each suffer from certain drawbacks. Firstly, in the case of room temperature implantation through silicide dopant clustering may take place which adversely impacts active dopant concentration at the silicide/semiconductor interface and thereby produces a higher than ideal contact resistance. Secondly, the room temperature implantation through silicide incurs an extra annealing step in order to properly activate the dopants implanted through silicide. In the approach in which the S/D region is highly doped before silicide formation, the process of silicide formation may adversely affect the desired distribution of active dopants at the silicide/semiconductor interface, also resulting in a lower than desired concentration of active dopants. It is with respect to these and other considerations that the present improvements have been needed.

SUMMARY

Embodiments are directed to methods and structures for improved contact resistance in transistor devices such as MOSFETs. In one embodiment a method of forming low contact resistance in a substrate includes forming a silicide layer on the substrate, the silicide layer and substrate defining an interface therebetween in a source/drain region. The method also includes performing a hot implant of a dopant species into the silicide layer while the substrate is at a substrate temperature greater than 150° C., where the hot implant is effective to generate an activated dopant layer containing the dopant species, and the activated dopant layer extends from the interface into the source/drain region.

DETAILED DESCRIPTION

The present disclosure will now be described more fully hereinafter with reference to the accompanying drawings, in which some embodiments are shown. The subject of this disclosure, however, may be embodied in many different forms and should not be construed as limited to the embodiments set forth herein. Rather, these embodiments are provided so that this disclosure will be thorough and complete, and will fully convey the scope of the subject of this disclosure to those skilled in the art. In the drawings, like numbers refer to like elements throughout.

Figure 1:
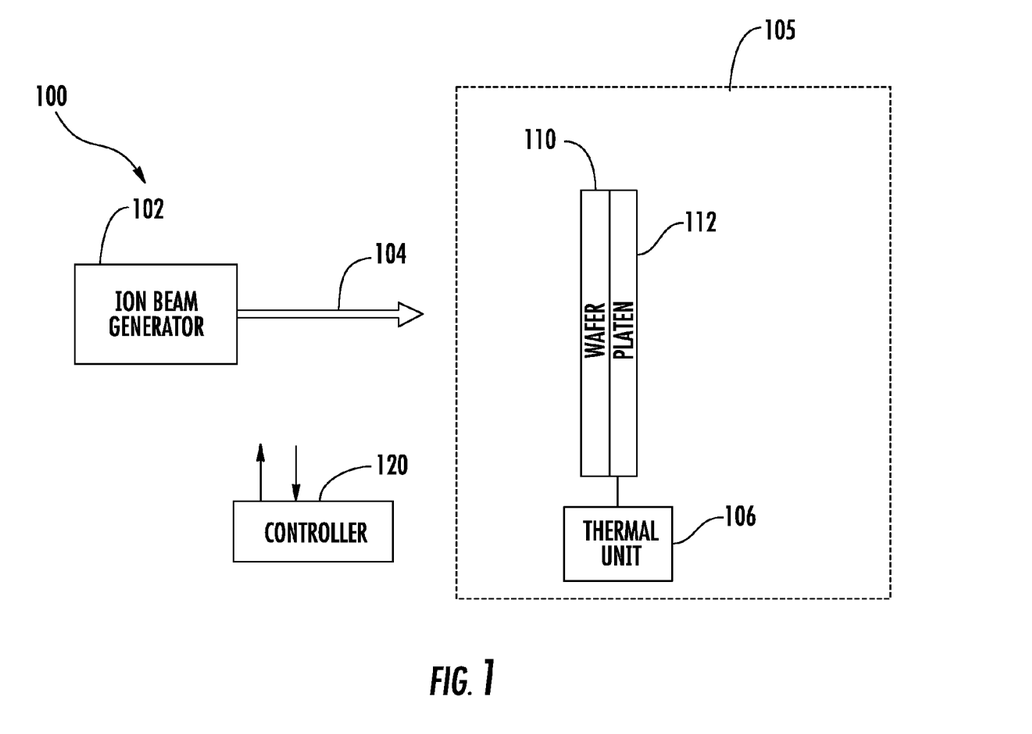
FIG. 1 is a simplified schematic diagram of an ion implanter.

Turning to FIG. 1, a block diagram of a simplified ion implanter 100 is shown. The ion implanter 100 is capable of performing a hot implant, which typically takes place at temperatures greater than 150° C. (unless otherwise noted, the term "hot implant" refers to performing an ion implantation process into a substrate when the substrate is at a temperature greater than 150° C.). In the present embodiments, some implants take place at temperatures greater than 300° C. while other take place at temperatures between 300° C. and 700° C. The ion implanter 100 includes an ion beam generator 102, end station 105, a platen 112, a thermal unit 106, and a controller 120. The ion beam generator 102 is configured to generate the ion beam 104 and direct it towards the front surface of the substrate 110, which may be a semiconductor substrate in various embodiments. Examples of semiconductor substrates include (bulk) silicon, germanium, silicon:germanium alloy (SiGe), SiGe:C alloy, a semiconductor-on insulator such as silicon-on-insulator (SOI) or SiGe-on insulator (SGOI), and other materials. The embodiments are not limited in this context. It is to be noted that, in conjunction with the term "substrate" the terms SiGe, SiGe:C, SOI, and SGOI, for example, refer to the layers of material that typically experience ion implantation consistent with the present embodiments. All of such substrates may comprise one or more layers of material, such as SiGe, which is disposed on an underlying silicon substrate.

The ion beam generator 102 may include many components known to those skilled in the art such as an indirectly heated cathode (IHC) ion source, an extraction assembly positioned proximate an extraction aperture of the ion source, a mass analyzer, acceleration/deceleration lenses, and so forth, which components provide the ion beam 104 with desired characteristics such as beam current, uniformity, and ion energy level.

In other embodiments the ion beam generator 102 may include a plasma source and extraction assembly located proximate the substrate 110. In such embodiments, the ion beam 104 may be provided to the substrate 110 without mass analysis. In still further embodiments, instead of an ion beam generator, ions may be provided to a substrate 110 by immersion in a plasma source such as a plasma deposition (PLAD) system as known in the art. The embodiments are not limited in this context.

Returning to FIG. 1, the ion beam 104 provided by the ion beam generator 102 may be a ribbon beam or a spot beam as is known in the art. The ion beam 104 may be distributed across the entire front surface of the substrate 110 by the ion beam movement, wafer movement, or a combination of the two. In one embodiment, the ion beam 104 may be a ribbon beam with an approximate rectangular cross sectional shape. In some embodiments, the substrate 110 may be mechanically driven in a direction perpendicular to the long dimension of the ribbon beam to distribute the ribbon beam across the entire front surface of the substrate 110. The entire path traversed by the ion beam 104 may be evacuated by a vacuum pumping system (not illustrated) to create a high vacuum condition as known to those skilled in the art.

The end station 105 may include the platen 112 and the thermal unit 106. The end station may also include automated wafer handling equipment (not illustrated) for introducing substrates to, and removing substrates from, the platen 112. Automated substrate handling equipment may also be configured to introduce substrates from atmospheric conditions through a load lock (not illustrated) to the platen 112 and out a load lock back to atmospheric conditions after ion treatment.

The thermal unit 106 is configured to heat the substrate 110 for a hot implant or to facilitate a room temperature implant in which the substrate 110 is unheated. For hot implants, the thermal unit 106 may include a heat source, e.g., a heating coil, embedded in the platen 112. Alternatively, the thermal unit 106 may include a heat source such as heat lamps that is external to the platen 112.

The controller 120 can be or can include a general purpose computer or network of general purpose computers that may be programmed to perform desired input/output functions. The controller 120 can also include other electronic circuitry or components, such as application specific integrated circuits, other hardwired or programmable electronic devices, discrete element circuits, etc. The controller 120 may also include communication devices, data storage devices, and software. The controller 120 may receive input signals from a variety of systems and components such as the ion beam generator 102 and thermal unit 106, and may provide output signals to each to control the same. For example, the controller 120 may output signals to control temperature for a hot implant of a desired species, and may output additional control signals to control ion energy for implanting ions. The ion implanter 100 has generally been described as a beam line ion implanter with reference to FIG. 1. However, as noted above, a plasma doping (PLAD) implanter or other apparatus may also be utilized to perform hot implants to treat the substrate 110. Those skilled in the art will recognize that a plasma doping implanter positions the substrate 110 within a processing chamber in which the plasma is generated to provide ions for the hot implant.

Figure 2:
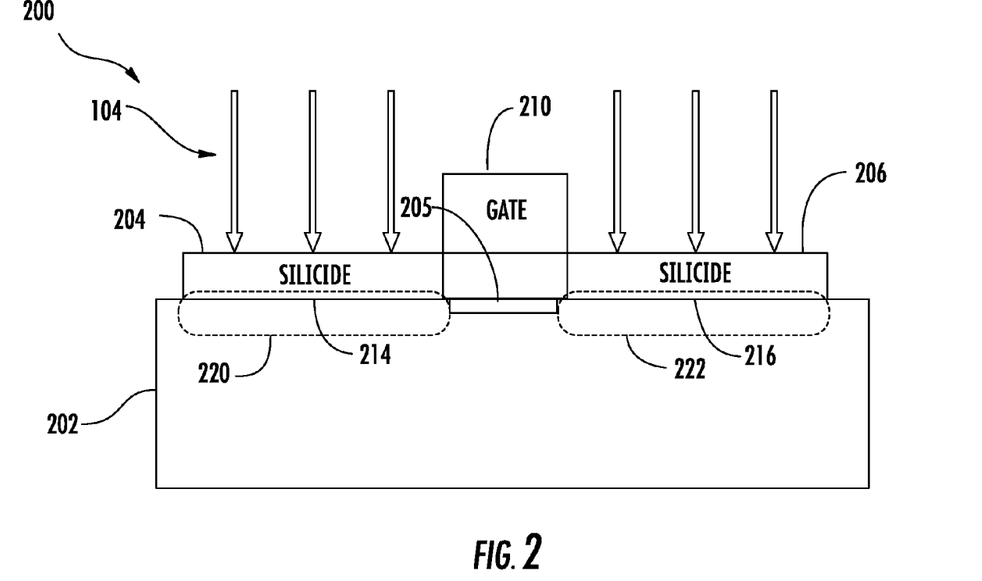
FIG. 2 is a cross-sectional view of a transistor treated by ions consistent with the ion implanter of FIG. 1.

Turning now to FIG. 2, a cross-sectional view of a MOSFET 200 is illustrated. The MOSFET 200 includes a contact layer which is referred to herein as a silicide layer 204, which is disposed on a substrate 202 to form part of a source/drain region on one side of channel 205, and a silicide layer 206 disposed on the opposite side of the silicon channel 205. The substrate 202 may be Si, SiGe, Ge, SiGe:C, SOI, SGOI, GaAs, GaN, InP, In GaAs, or other 3:5 compound formed from elements selected from groups 3 and 5 of the periodic table. The embodiments are not limited in this context. In embodiments in which the substrate 202 is a silicon containing material, the silicide layer may be fabricated of nickel silicide (NiSi), platinum silicide (PtSi), nickel platinum silicide (NiPtSi), cobalt silicide ($CoSi_2$), titanium silicide ($TiSi_2$) or other silicide material. The embodiments are not limited in this context. Unless otherwise indicated the terms "nickel silicide" or "NiSi" generally refer to the nickel monosilicide phase, "titanium silicide" generally refers to the $TiSi_2$ titanium disilicide phase, and in particular to the C54 $TiSi_2$ phase, while the term cobalt silicide refers to the refers to the $CoSi_2$ cobalt disilicide phase. In embodiments in which the substrate 202 includes Ge, such as SiGe, the "silicide" layers 204 and 206 may include cobalt-, titanium-, or nickel germanosilicide phases as known in the art. In embodiments in which the substrate 202 is a 3:5 material, a contact layer may be composed of any convenient metal to contact the source/drain region of the 3:5 substrate. Examples of silicide thicknesses include, for NiPtSi: ~300 Å, for $CoSi_2$: ~200 Å, for $TiSi_2$: ~200 Å. The embodiments are not limited in this context.

As illustrated in FIG. 2, the MOSFET 200 includes a gate electrode 210 that controls conduction across the channel 205 which connects source/drain regions 220, 222. An interface 214 is formed between the silicide layer 204 and substrate 202 and an interface 216 is formed between the silicide layer 206 and substrate 202. For clarity, further explanation may be limited to the interface 214 although the explanation also apples to interface 216.

Figure 3A:
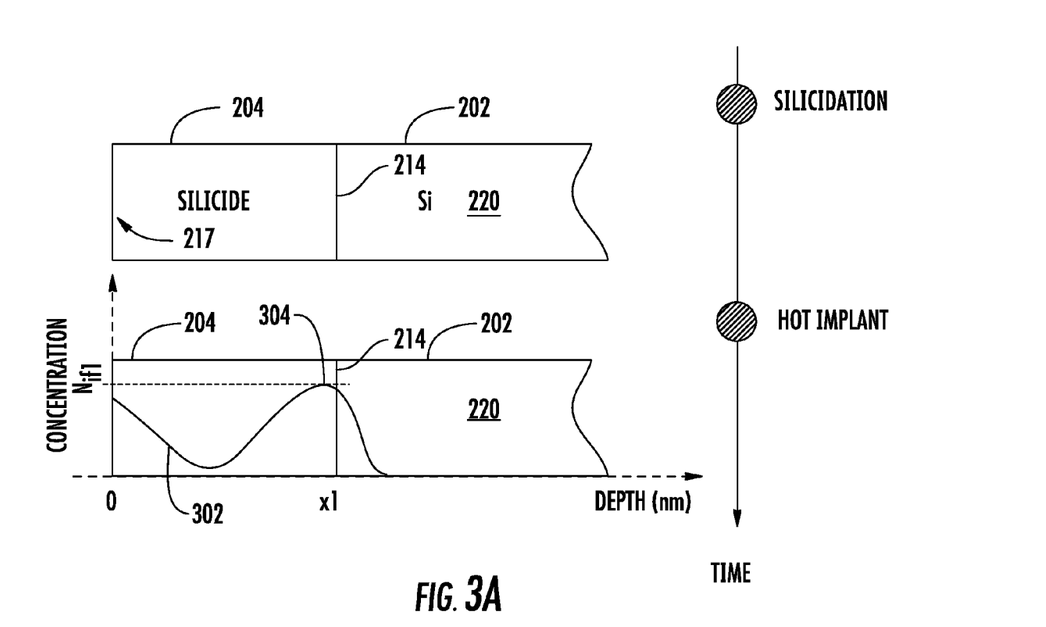
FIG. 3A presents a portion of the view of FIG. 2 before and after receiving a hot ion implant.

Turning to FIG. 3A, a partial cross-sectional view of the silicide layer 204, the substrate 202, and the interface 214 is illustrated to detail formation of a dopant profile 302 within the silicide layer 204 and substrate 202. Depth is positioned along the X-axis while the concentration of activated dopant is positioned along the Y-axis. In various embodiments, the distance x1 may be between about 10 nm and 100 nm from the top surface 217 of the silicide layer 204.

In operation, to first form the silicide layer 204, a metal such as Ni, Co, Ti, or Pt may be deposited on the MOSFET 200. In one implementation termed a "salicide" process as known in the art, the metal may be deposited in a blanket deposition and reacted with the semiconducting material in source/drain regions 220, 222 by heating MOSFET 200, thereby forming the silicide layer 204 and interface 214. It will be appreciated by those of skill in the art that the representation of silicide layers 204 and 206 in FIG. 2 is highly idealized, and that the interface 214 may extend below the level depicted in FIG. 2 in some cases. Alternatively, the silicide layer 204 may be formed by selectively depositing the silicide material from gas-phase precursors as is known in the art. The embodiments are not limited in this context.

A hot implant process using ions 104 is then performed into the silicide layer 204 by an ion implanter consistent with the embodiments described above and in particular depicted in FIG. 1. The implant species of ions 104 used in the hot implant process may be any species that is capable of changing the Fermi level in the semiconductor material of substrate 202, that is the material of source/drain (also termed "S/D") regions 220, 222. A non-exclusive list of implant species may be P, As, Al, Se, S, Te, and B. In various embodiments, the energy of ions 104 during the hot ion implant may be on the order of 1 keV to 10 keV and in particular, 2 keV to 5 keV. With all other parameters being equal, dopant species tend to penetrate to greater depths within a solid with higher ion energies. The energy of the hot ion implant may therefore be adjusted to locate the dopant species within the desired depth range with respect to the interface 214. As noted, in various embodiments the hot implant is performed at a temperature in the range greater than about 150° C. to about 700° C. Considerations for limiting the upper range of temperature used for a hot implant include the specific characteristics of the silicide layer 204. By limiting the temperature below an upper limit, agglomeration of silicide layer 204 as well as other reactions may be prevented. For example, a hot implant temperature exceeding 700° C. should generally be avoided for NiSi and/or NiPtSi contacts which may agglomerate at higher temperatures. Additionally, an NiSi layer may tend to react further with a silicon source/drain region to form the undesirable $NiSi_2$ nickel disilicide phase The hot implant process through silicide layer 204 generates a dopant profile of active dopant species. As previously noted, a resulting dopant profile 302 after performing of a hot implant is shown in FIG. 3A. Within the S/D region 220 the dopant profile 302 may represent a profile of active dopants. The dopant profile 302 includes a peak concentration 304 that occurs inside the silicide layer 204 at a depth with respect to the surface top 217 just above the interface 214. Other dopant profiles may have a peak concentration occurring at the interface 214. However, in some cases, a substantial "tail" of the dopant profile 302 may take place into the source/drain region 220, which may cause increased leakage current. Accordingly, the exact placement of the peak concentration of a dopant profile may balance out the need to increase the concentration of active dopant species at the interface 214 with the need to maintain leakage at an acceptable level.

Consistent with the present embodiments the contact resistivity is decreased for a source/drain contact by performing a hot implant to introduce dopants into a contact material such as a silicide that is pre-formed on the source/drain region. In various embodiments the dose of ions used during hot implant may range from about 1E14 $cm^{-2}$ to 1E16 $cm^{-2}$ depending upon such factors as the thickness of the silicide layer to be implanted, the desired peak concentration of active dopants and the depth of the implanted region of active dopants to be formed. However, the embodiments are not limited in this context. The contact resistivity at a silicide/silicon interface is given by equation (1):

$$\rho_c = C_1 \exp C_2 \left( \frac{q\Phi_B}{(N_{if})^{1/2}} \right) \quad (1)$$

Where $\rho_c$ is the specific contact resistivity (also termed herein "contact resistivity"), $\Phi_B$ is Schottky barrier height (SBH), $N_{if}$ is the dopant concentration at the silicide/Si interface, q is the electronic charge, and $C_1$ and $C_2$ are constants. The hot implant process reduces contact resistivity by increasing the level of dopant activation at the interface 214. In particular the hot implant process enables the value of the dopant concentration $N_{if1}$ achievable with a hot implant to be increased compared to that activation level $N_{if2}$ obtainable by room temperature implantation. Such that $N_{if1} > N_{if2}$. Accordingly, a higher dopant concentration results in a lower hot implant contact resistivity $\rho_{c1}$ compared to a room temperature contact resistivity $\rho_{c2}$. In some examples, the contact resistivity produced by the hot implant is $2E^{-8}$ $\Omega cm^2$ or lower.

Figure 3B:
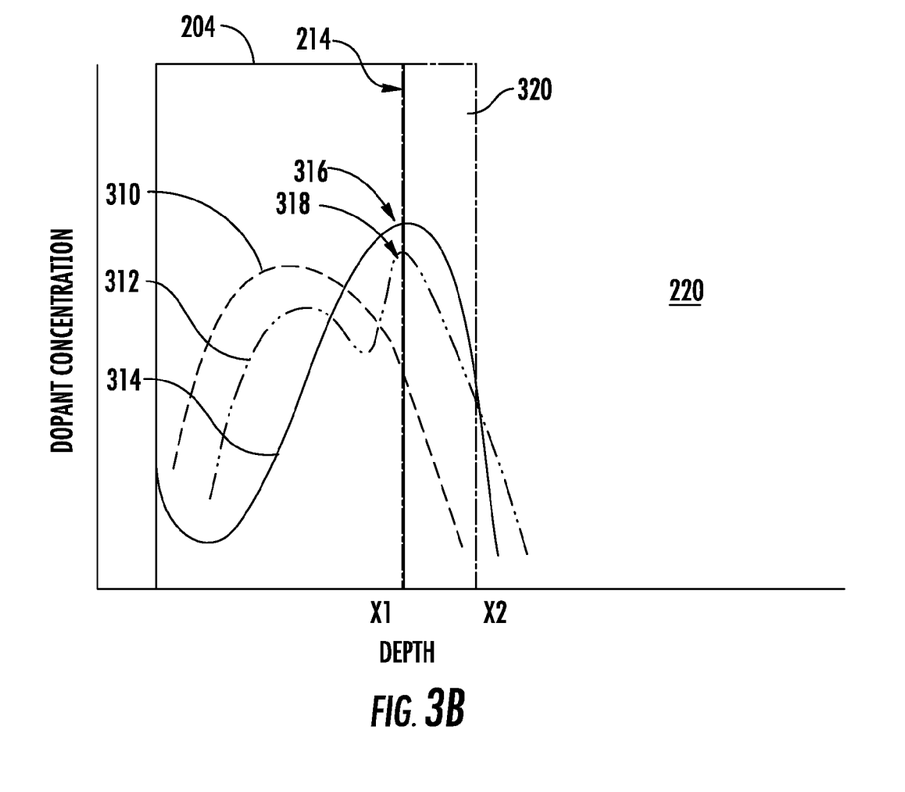
FIG. 3B presents a portion of the view of FIG. 2 showing a comparison of dopant profiles for hot implant and room temperature implant.

FIG. 3B depicts another partial cross-sectional view of the silicide layer 204, the substrate 202, and the interface 214 is illustrated to compare dopant profile achieved by the present embodiments with a conventional dopant profile. The FIG. 3B exhibits three different dopant profiles each of which may represent a similar ion dose of the same species. The dopant profile 310 is characteristic of a conventional process in which a room temperature implant is performed. The dopant profile 310 in particular shows the as-implanted dopant distribution before subsequent annealing. The peak of the dopant profile 310 is located well away from the interface 214. The dopant profile 312 represents the dopant distribution after annealing of a substrate having the dopant profile 310. The annealing may be conventional rapid thermal annealing that is performed to activate dopants in the source/drain region 220 and to drive the dopants towards the interface 214. As illustrated, a peak in dopant concentration 318 may occur near or at the interface 214. The dopant profile 314 represents a dopant distribution achieved after a hot implant performed according to the present embodiments. Again, no post-implant annealing process is performed to produce the dopant profile 314. As shown, the dopant profile 314 exhibits a higher peak concentration 316 of dopants at the interface 214, which may produce a higher concentration of active dopant species at the interface 214 and just below the interface 214 in the source/drain region 220.

As further illustrated in FIG. 3B, the dopant profile 314 may define an activated dopant layer 320 that extends from the interface 214 into the source/drain region 220. In various the activated dopant layer 320 is effective to create a dopant segregated Schottky (DSS) contact. As is known in the art, DSS contacts are formed by creating a thin, highly doped layer in a semiconductor material adjacent the metal contact. In some embodiments the peak concentration of activated dopants is $1E20/cm^3$ or higher and in particular is $2E20/cm^3$ or higher. The highly doped activated dopant layer is able to adjust the Fermi level of the semiconductor material in the source/drain region 220 and lower the effective Schottky barrier height between silicide layer 204 and semiconductor material of source/drain region 220. As seen from equation (1) above this has the effect of lowering the specific contact resistivity $\rho_c$. Moreover, the higher the active dopant concentration in such an activated dopant layer, the more the specific contact resistivity may be lowered. Accordingly, because the concentration of active dopants in activated dopant layer 320 may exceed that achieved by conventional room temperature implant/post implant anneal processes, as represented by dopant profile 312, the specific contact resistivity in a MOSFET produced by the hot implant process may be lower than that produced by the conventional process. As shown in FIG. 3B a tail of activated dopants may extend into the source/drain region beyond the boundary marked for the activated dopant layer. It is to be noted that active dopant concentration within the activated dopant layer 320 may vary and the depth of the activated dopant layer may be set at any convenient point such as the depth at which the concentration of activated dopants is about $1E19$ $cm^{-2}$. In some embodiments the depth X2 of the activated dopant layer may be about 2 nm to 10 nm below the interface 214.

Figure 4:
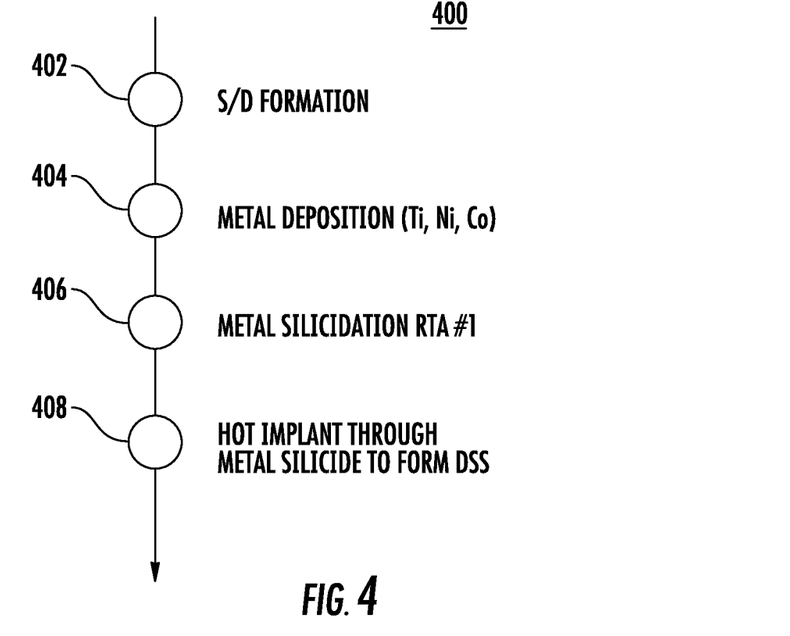
FIG. 4 is a flow chart of one method consistent with an embodiment of the disclosure.

FIG. 4 illustrates a flow chart 400 of one method consistent with the present disclosure. A source/drain formation operation 402 is followed by metal deposition 404 onto a semiconductor substrate. In some examples the metal deposited may be Ti, Co, Ni, or Pt. Metal silicidation 406 is performed by heating the semiconductor substrate, for example by a rapid thermal annealing (RTA) process, which forms a silicide layer. Finally, a hot implant 408 is performed into the silicide layer that is disposed on the semiconductor substrate, which is effective to form a dopant segregated Schottky contact with improved contact resistance due to the higher dopant concentration at the silicide/silicon interface.

Figure 5:
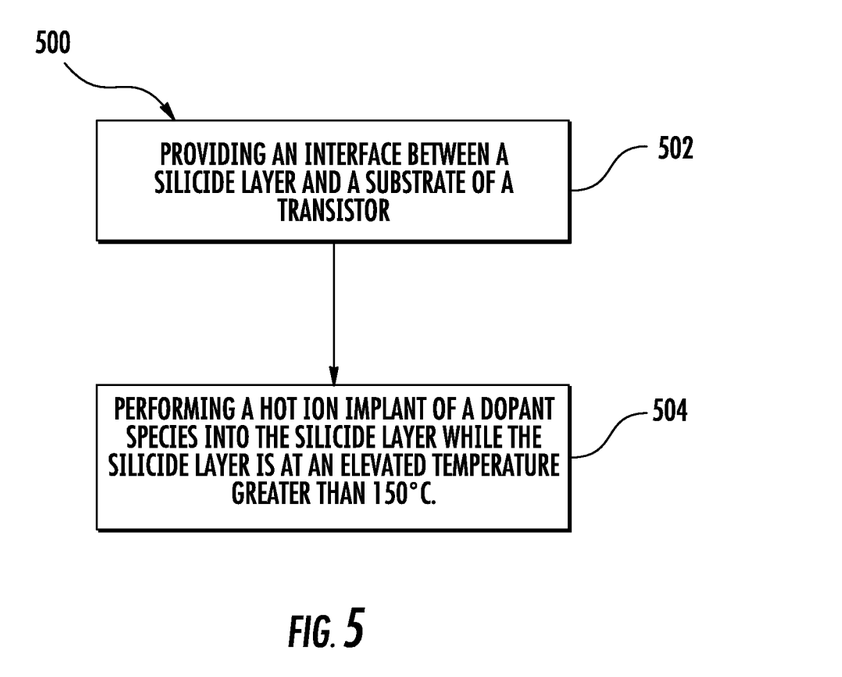
FIG. 5 is a flow chart of another method consistent with another embodiment of the disclosure.

Turning to FIG. 5, there is shown a flow chart 500 of another method consistent with the present disclosure. The method includes providing an interface between a silicide layer and substrate of a transistor 502. In various embodiments the providing the interface may take place by reacting a metal with a semiconductor material in the source/drain region of the transistor, while in other embodiments a silicide may be directly formed by, for example selective deposition from the vapor phase. A hot implant of a dopant species into the silicide layer 504 is then performed while the silicide layer is at an elevated temperature greater than 150° C.

In various embodiments for forming a CMOS device, separate hot implant operations are performed to form low contact resistance source/drain contacts to respective pFET and nFET devices. For example a first hot implant may involve implanting boron into silicide layers formed in source/drain regions of a pFET device, while a second hot implant involves implanting arsenic into silicide layers formed in source/drain regions of an nFET device. In particular embodiments the temperature of hot implants may be tailored according to the type of FET being implanted. Thus, the temperature of an nFET hot implant may differ from that of a pFET hot implant. Depending upon the silicide material and semiconductor material the temperature of nFET hot implant may be higher or lower than that of the pFET hot implant. In further embodiments, only a single FET-type such as an nFET may be subjected to a hot implant while the other FET type is subject to room temperature implantation followed by RTA processing to form the low resistance pFET contact, for example. This latter approach may be useful to minimize the overall thermal budget experienced by doped S/D regions.

Although the aforementioned embodiments have generally been described with respect to a conventional planar transistor device structure, the hot implant process disclosed herein may also be used to form low contact resistance contacts in various other known device structures including fin-type field effect transistors (finFET) semiconductor nanowire structures, and other three dimensional device structures. The embodiments are not limited in this context.

Advantageously, there has been provided a method of performing a hot ion implant into a silicide layer to increase the dopant concentration (Nif) at a selected silicide/semiconductor interface. The hot implant also facilitates simultaneous activation and drive in of dopant species. Therefore, compared to conventional methods, an annealing step to subsequently activate and drive in the dopant is unnecessary. This saves at least one process step and associated time and costs, leading to an optimized and simplified device integration flow. Furthermore, another benefit of the hot ion implant is that the active dopant concentration achievable at the silicide/semiconductor interface is greater than that achievable by using a room temperature implant followed by annealing. Importantly this leads to a reduction in specific contact resistivity and contact resistance of the silicide/semiconductor interface. This enables improved device performance for transistor devices such as MOSFETs and CMOS, and enables further scaling of transistor devices to smaller dimensions. Transistors including planar structures, finFETs, and nanowires may all benefit from the hot implant process of the present embodiments. The hot implant method also provides for early dopant activation without agglomeration of the silicide layer thereby avoiding the need to perform a post-implant anneal. Dopant losses are also minimized since the hot ion implantation is performed into the silicide layer.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of forming low contact resistance in a substrate, comprising
    forming a silicide layer on the substrate, the silicide layer and substrate defining an interface therebetween in a source/drain region; and
    performing a hot implant of a dopant species into the silicide layer while the substrate is at a substrate temperature greater than 150° C., the hot implant effective to generate an activated dopant layer containing the dopant species, the activated dopant layer extending from the interface into the source/drain region, wherein the activated dopant layer comprises a dopant segregated Schottky contact in which a Schottky barrier height between the silicide and source/drain region is lower than a Schottky barrier height between the silicide and source/drain region when the activated dopant layer is not present.

2. The method of claim 1, wherein the dopant species is P, As, Al, Se, S, Te, or B.

3. The method of clam 1, further comprising implanting the dopant species into the silicide layer at an ion energy of 1 keV to 10 keV.

4. The method of claim 1, further comprising performing the hot implant at a substrate temperature less than 700° C.

5. The method of claim 1, wherein the source/drain region comprises Si, a Si:Ge alloy, a Si:C alloy, an Si:Ge:C alloy, or Ge.

6. The method of claim 1, wherein the substrate comprises a planar semiconductor transistor device structure, a finFET device structure, or a semiconductor nanowire transistor structure.

7. The method of claim 1, wherein the substrate comprises a bulk semiconductor substrate or a semiconductor-on-insulator structure.

8. The method of claim 1, wherein the forming the silicide layer comprises forming NiSi, NiPtSi, CoSi$_2$, TiSi$_2$, NiSi$_{1-x}$Ge$_x$, Ti(Si$_{1-y}$Ge$_y$)$_2$ or cobalt silicide-germanide.

9. The method of claim 1, further comprising implanting the dopant species at a dose of about 1E14 cm$^{-2}$ to 1E16 cm$^{-2}$.

10. The method of claim 1, the performing the hot implant comprising performing a first implant process comprising implanting a p-type dopant into source/drain regions of first transistors of the substrate, and performing a second implant process comprising implanting a second dopant species comprising an n-type dopant into source/drain regions of second transistors of the substrate.

11. The method of claim 10, comprising:
performing the first implant process at a first substrate temperature greater than 150° C.; and
performing the second implant process at a second substrate temperature different from the first substrate temperature and greater than 150° C.

12. The method of claim 10, comprising:
performing the first implant process at a first substrate temperature less than 700° C.; and
performing the second implant process at a second substrate temperature different from the first substrate temperature.

13. The method of claim 10, comprising performing the first implant process before performing the second implant process.

14. The method of claim 1, wherein a peak dopant concentration of the activated dopant layer occurs at the interface.

15. The method of claim 14, wherein the peak dopant concentration of the activated dopant layer is $1E20/cm^3$ or higher.

16. A method of forming low contact resistance in a substrate, comprising
forming a silicide contact layer on a source/drain region of the substrate, the source/drain region comprising a silicon-containing material, the silicide layer and substrate defining an interface therebetween in a source/drain region; and
performing a hot implant of a dopant species into the silicide layer while the substrate is at a substrate temperature greater than 150° C., wherein the hot implant comprises an ion dose effective to generate an activated dopant layer containing the dopant species at a peak concentration greater than about $1E20/cm^2$ that extends from the interface into the source/drain region, wherein the activated dopant layer comprises a dopant segregated Schottky contact in which a Schottky barrier height between the silicide and source/drain region is lower than a Schottky barrier height between the silicide and source/drain region when the activated dopant layer is not present.

17. The method of claim 16, wherein specific contact resistivity of the silicide contact layer to the source/drain region is about $2 E^{-8}$ $\Omega cm^2$ or less.

18. The method of claim 16, wherein the hot implant is effective to cause a Fermi level change in the source/drain region.

19. The method of claim 16, wherein the substrate temperature is between 400° C. and 700° C.

20. A method of forming low contact resistance in a substrate, comprising
forming a silicide layer on the substrate, the silicide layer and substrate defining an interface therebetween in a source/drain region; and
performing a hot implant of a dopant species into the silicide layer while the substrate is at a substrate temperature greater than 150° C., the hot implant effective to generate an activated dopant layer containing the dopant species, the activated dopant layer extending from the interface into the source/drain region, wherein performing the hot implant comprises:
performing a first implant process comprising implanting a p-type dopant into source/drain regions of first transistors of the substrate, the first implant process performed at a first substrate temperature greater than 150°, and
performing a second implant process comprising implanting a second dopant species comprising an n-type dopant into source/drain regions of second transistors of the substrate, the second implant process performed at a second substrate temperature different from the first substrate temperature and greater than 150° C.

* * * * *